United States Patent [19]
Chiou

[11] Patent Number: 5,475,564
[45] Date of Patent: Dec. 12, 1995

[54] CPU HEAT SINK HOLDING-DOWN DEVICE

[76] Inventor: Ming D. Chiou, 3F., No. 4, Alley 11, Lane 327, Sec. 2, Chung Shan Rd., Chung Ho City, Taipei, Taiwan

[21] Appl. No.: 359,482

[22] Filed: Dec. 20, 1994

[51] Int. Cl.⁶ .................................................. H05K 7/20
[52] U.S. Cl. .......................... 361/704; 24/615; 411/530; 257/727; 361/687; 361/697
[58] Field of Search ............................ 24/296, 457–459, 24/500, 502, 544, 615, 625; 411/352, 516–530; 174/16.3; 165/80.3, 185, 122, 126; 257/706, 707, 713, 718, 719, 727; 248/316.7, 505, 510; 267/150, 160; 361/687, 690, 695, 697, 704, 747, 717–719

[56] References Cited

U.S. PATENT DOCUMENTS

| | | | |
|---|---|---|---|
| 4,589,170 | 5/1986 | Ponting | 24/456 |
| 5,208,731 | 5/1993 | Blomquist | 361/386 |
| 5,357,404 | 10/1994 | Bright | 361/818 |
| 5,371,652 | 12/1994 | Clemens | 361/704 |
| 5,386,338 | 1/1995 | Jordan | 361/704 |
| 5,430,610 | 7/1995 | Hung | 361/697 |

Primary Examiner—Gerald P. Tolin
Attorney, Agent, or Firm—Pro-Techtor International

[57] ABSTRACT

A CPU heat sink holding-down device including a CPU holder, a CPU mounted on the CPU holder, and a heat sink fastened to the CPU holder to hold down the CPU, wherein the heat sink has a fixed loop-like hanger pivotably disposed at one vertical side thereof and hung on a first retainer rod at one vertical side of the CPU holder, two locating bar extended out of an opposite vertical side thereof, a screw rod connected between the locating bars, a movable loop-like hanger turned about said screw rod and hung on a second retainer rod at an opposite vertical side of the CPU holder, and a curved spring plate connected to the movable loop-like hanger for lifting the movable loop-like hanger from the second retainer rod.

1 Claim, 4 Drawing Sheets

CPU HEAT SINK HOLDING-DOWN DEVICE

BACKGROUND OF THE INVENTION

The present invention relates to a CPU heat sink holding down device for fastening a heat sink to a CPU holder to hold down a CPU by a movable loop-like hanger and a fixed loop-like hanger.

Various computers are well known, and intensively used in every field to replace a variety of complicated jobs. In a computer system, the CPU is one of the most import part. During the operation of a computer system, the CPU will release heat. If heat cannot be quickly carried away, the operation of the CPU and the nearby electronic components will be affected, causing operation errors. Heat sinks are commonly used and mounted on the CPU holder to hold down the CPU. Regular heat sinks generally have fastening devices for fastening to the CPU holder. However, these fastening devices are specifically designed for specific CPU holders, i.e., they are not suitable for all CPU holders.

SUMMARY OF THE INVENTION

According to one aspect of the present invention, the heat sink has a fixed loop-like hanger at one side and a movable loop-like hanger at an opposite side for fastening to respective retainer rods at two opposite side of any of a variety of CPU holder. The second loop-like hanger is relatively smaller than the fixed loop-like hanger, and can be turned about and moved along a transverse screw rod, and therefore the second loop-like hanger can be conveniently adjusted to the operative position and secured to the corresponding retainer rod on the CPU holder.

According to another aspect of the present invention, a curved spring plate is coupled to the movable loop-like hanger and acted as a lever for lifting the movable loop-like hanger from the corresponding retainer rod on the CPU holder during a repair or maintenance work.

DETAILED DESCRIPTION OF THE PREFERRED EMBODIMENT

Figure 1:
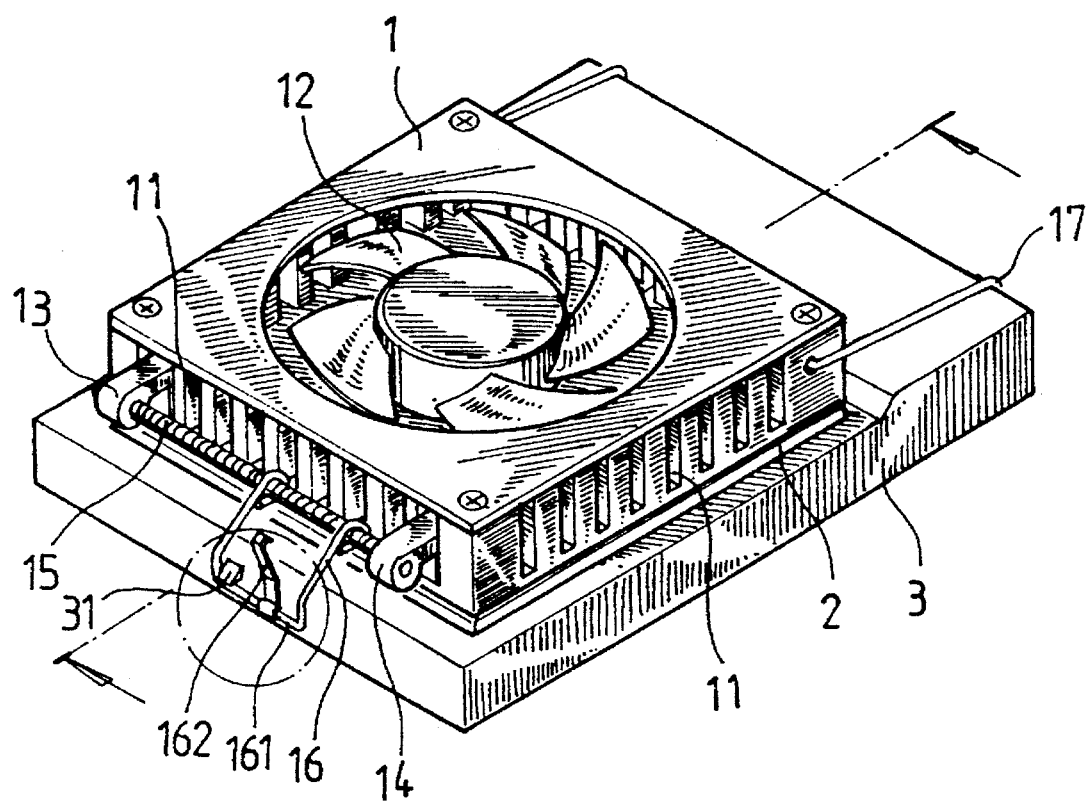
FIG. 1 is an elevational view of a CPU heat sink holding-down device according to the present invention.

Referring to FIG. 1, a CPU heat sink holding-down device in accordance with the present invention is generally comprised of a CPU holder 3, a CPU 2 mounted on the CPU holder 3, and a heat sink 1 fastened to the CPU holder 3 to hold down the CPU 2. The heat sink 1 comprises a plurality of heat dissipating holes 11 spaced around the vertical sides thereof, a fixed loop-like hanger 17 pivotably disposed at one vertical side thereof, two locating bars 13 and 14 extended out of an opposite vertical side thereof, a screw rod 15 connected between the locating bars 13 and 14, and a movable loop-like hanger 16 turned about the screw rod 15. A fan 12 is disposed within the heat sink 1 and controlled to cause currents of air for cooling. The CPU holder 3 has two retainer rods 31 at two opposite vertical sides thereof. When the heat sink 1 is placed on the CPU2 above the CPU holder 3, the fixed and movable loop-like hangers 17 and 16 are respectively hung on the retainer rods 31 of the CPU holder 3 to hold down the heat sink 1. The movable loop-like hanger 16 has a fastening portion 161, which is releasably fastened to one retainer rod 31, mounted with a curved spring plate 162.

Figure 2:
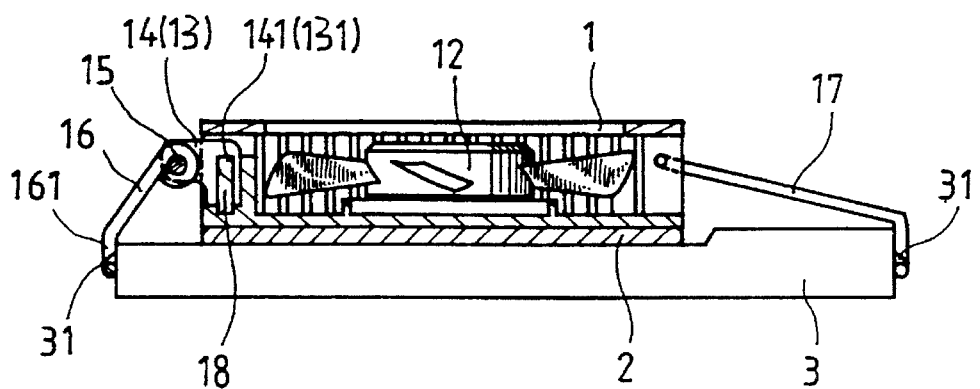
FIG. 2 is a side view in section of the CPU heat sink holding-down device shown in FIG. 1.

Referring to FIG. 2, the locating bars 13 and 14 have a respective forked rear end 131 or 141 turned at right angles and releasably mounted on a respective support 18 inside the heat sink 1.

Figure 3:
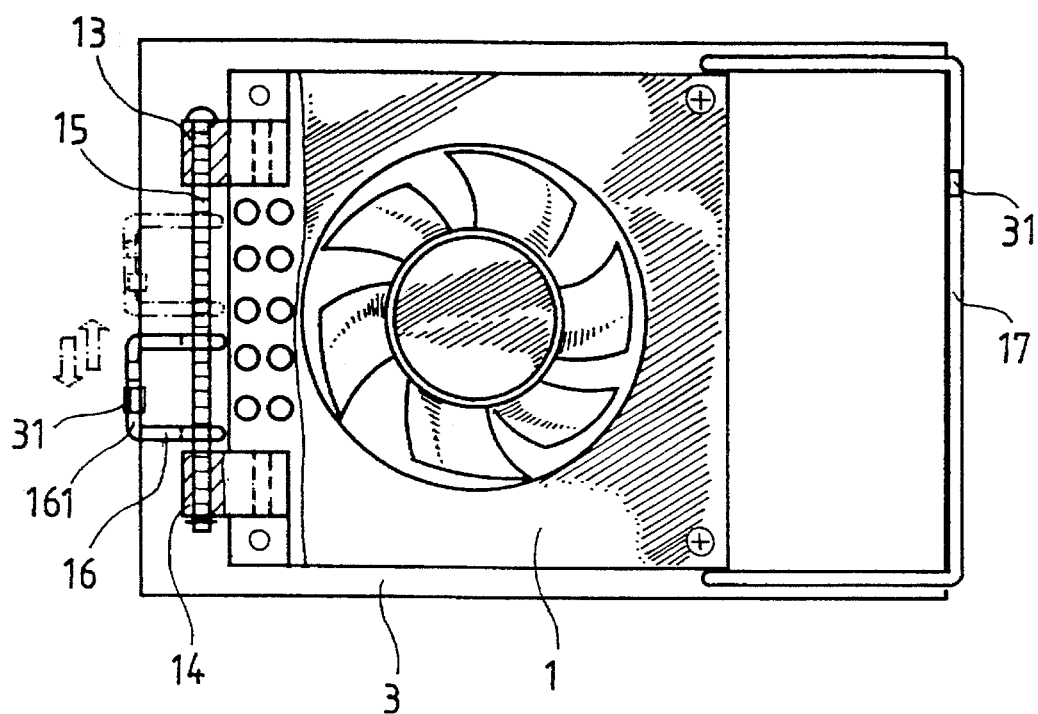
FIG. 3 is a top plain view of FIG. 1, showing the movable loop-like hanger moved along the screw rod.

Referring to FIG. 3, the movable loop-like hanger 16 can be moved along the screw rod 15 to the effective position aiming at the corresponding retainer rod 31 on the CPU holder3.

Figure 4A:
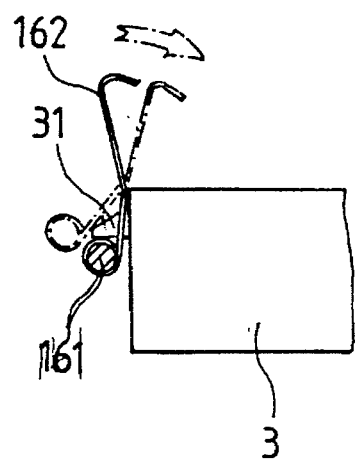
FIG. 4A shows the curved spring plate served as a first class lever and operated.
Figure 4B:
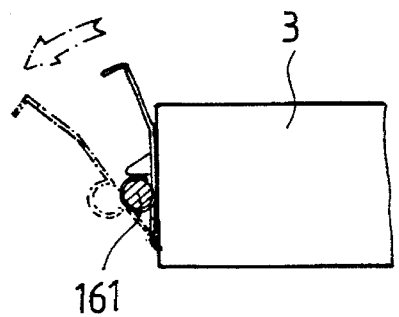
FIG. 4B shows the curved spring plate served as a second class lever and operated.

Referring to FIG. 4A and 4B, the curved spring plate 162 can be used as a lever to lift the fastening portion 161 of the movable loop-like hanger 16 from the corresponding retainer rod 31. In FIG. 4A, the curved spring plate 162 acts as a first class lever. In FIG. 4B, the curved spring plate 162 acts as a second class lever.

While only one embodiment of the present invention has been shown and described, it will be understood that various modifications and changes could be made without departing from the spirit and scope of the invention.

What is claimed is:

1. A CPU heat sink holding-down device comprising a CPU holder, a CPU mounted on said CPU holder, and a heat sink fastened to said CPU holder to hold down said CPU, wherein said heat sink comprises a fixed loop-like hanger pivotably disposed at one vertical side thereof hung on a first retainer rod at one vertical side of said CPU holder, two locating bars extended out of an opposite vertical side of said heat sink, a screw rod connected between said locating bars, a movable loop-like hanger turned about said screw rod and hung on a second retainer rod at an opposite vertical side of said CPU holder, and a curved spring plate connected to said movable loop-like hanger for lifting said movable loop-like hanger from said second retainer rod.

\* \* \* \* \*